(12) United States Patent
Bacrania et al.

(10) Patent No.: US 6,570,523 B1
(45) Date of Patent: May 27, 2003

(54) ANALOG TO DIGITAL CONVERTER USING SUBRANGING AND INTERPOLATION

(75) Inventors: Kantilal Bacrania, Palm Bay, FL (US); Hsin-Shu Chen, Melbourne, FL (US); Eric C. Sung, Palm Bay, FL (US); Bang-Sup Song, La Jolla, CA (US); J. Mikko Hakkarainen, Palm Beach Gardens, FL (US); Brian L. Allen, West Melbourne, FL (US); Mario Sanchez, Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 10/097,677

(22) Filed: Mar. 13, 2002

Related U.S. Application Data

(60) Provisional application No. 60/356,610, filed on Feb. 13, 2002.

(51) Int. Cl.[7] .............................. H03M 1/12; H03M 1/78
(52) U.S. Cl. ........................................ 341/155; 341/154
(58) Field of Search ................................ 341/155, 156, 341/120, 159, 133, 138, 154; 327/103, 540; 348/725; 375/247

(56) References Cited

U.S. PATENT DOCUMENTS

| 4,894,656 | A | * | 1/1990 | Hwang et al. | 341/120 |
| 4,896,155 | A | * | 1/1990 | Craiglow | 341/120 |
| 4,947,168 | A | * | 8/1990 | Myers | 341/120 |
| 5,099,240 | A | * | 3/1992 | Nakatani et al. | 341/156 |
| 6,384,757 | B1 | * | 5/2002 | Kosonen | 341/120 |

* cited by examiner

Primary Examiner—Patrick Wamsley
(74) Attorney, Agent, or Firm—Gary R. Stanford

(57) ABSTRACT

A multistage ADC that subranges and interpolates, and that amplifies selected subranges to convert an analog signal to a stream of digital values. The ADC samples the analog signal and provides a stream of sample signals. A first stage flash converts each sample signal into a first multiple bit value and subranges a reference ladder according to the first multiple bit value into selected reference signals. Each additional secondary stage amplifies a selected subrange of signals from a prior stage, flash converts the amplified residual signals to provide an additional multiple bit value, interpolates each set of amplified residual signals and subranges the interpolated signals according to the corresponding multiple bit value. A final stage amplifies and flash converts to determine a final multiple bit value. An error corrector combines each set of multiple bit values into a digital value.

40 Claims, 7 Drawing Sheets

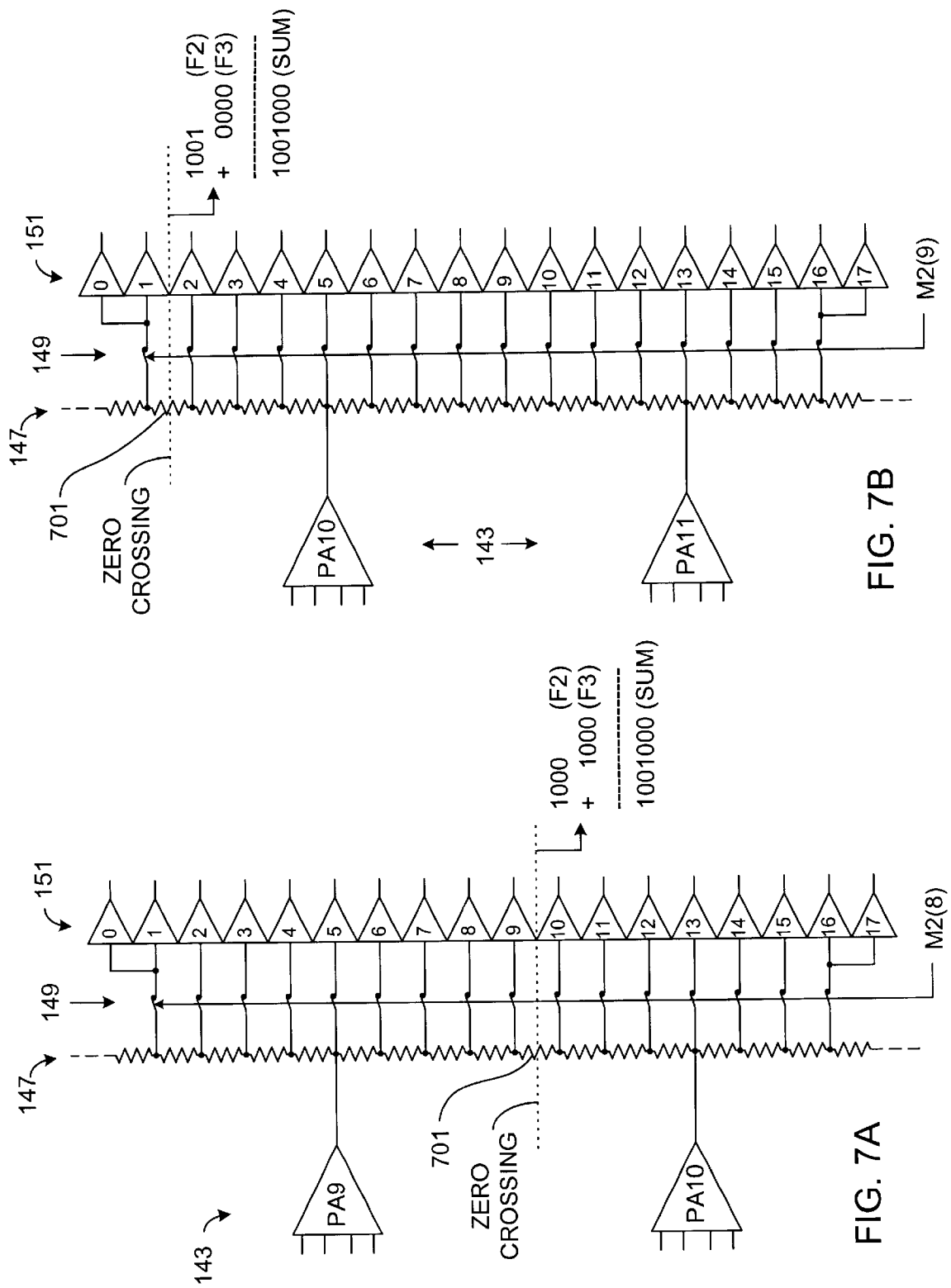

ANALOG TO DIGITAL CONVERTER USING SUBRANGING AND INTERPOLATION

CROSS-REFERENCE TO RELATED APPLICATION(S)

The present application is based on U.S. Provisional Patent Application entitled "An Analog To Digital Converter", Ser. No. 60/356,610, filed Feb. 13, 2002, which is hereby incorporated by reference in its entirety.

FIELD OF THE INVENTION

The present invention relates to analog to digital converters, and more particularly to an analog to digital converter that utilizes subranging and interpolation in a pipelined architecture that converts analog samples into corresponding digital values.

DESCRIPTION OF RELATED ART

Analog to digital converters (ADCs) perform a common and basic function that is necessary in many different types of applications. The primary function of an ADC is to convert an analog input signal to a digital value or binary code for use by various circuits and electronic devices. ADCs range in size, complexity, and accuracy or resolution, where each of these factors depend upon the particular needs of the underlying application. An ADC in accordance with the present invention is illustrated for an application that requires a relatively high degree of accuracy and resolution. It is appreciated, however, that although embodiments of the present invention enable such capabilities, the present invention is not limited to any particular types of ADCs or their applications but instead is applicable to any ADC and application regardless of specific requirements.

Embodiments of the present invention may be employed, for example, in a cellular telephone base station in which it is desired to detect and resolve a broad range of signals in a wireless infrastructure. Within a given cell of a cellular infrastructure, different cell phones operate at different power levels and frequencies. The ADC employed at the front end of the base station must be able to digitize the entire bandwidth of operation to service all cellular phones within its cell. The cell phones are mobile and at variable distances from the base station. The base station must be able to resolve the "near-far" issue and detect all signals within the cell regardless of distances and power levels, and must be able to distinguish between strong and relatively weak signals.

It is desired that an ADC employed in a cellular base station application digitize an input analog signal with a very high degree of accuracy. The ADC should exhibit a high degree of linearity, have a relatively high resolution with a high signal to noise ratio (SNR). In the cellular base station application, for example, it is desired that the ADC have a resolution of 14 bits with a spurious free dynamic range (SFDR) of 105 dBc and with an SNR of greater than 75 dB and operate at a Nyquist rate of approximately 80 MHz to accurately represent an input signal with a bandwidth of 40 MHz. Such 14-bit resolution is analogous to being able to distinguish the approximate thickness of a human hair on an 8 foot wall. The requisite SFDR enables determination of whether the variation of the thickness of the hairs laid over the entire 8 foot wall is no more than 10% of the nominal thickness (assuming the wall is perfectly flat).

ADCs are commonly integrated into a monolithic unit on one substrate of an integrated circuit (IC) or chip. Silicon, however, only allows up to about 10 bits of matching and is insufficient alone to achieve higher resolution. Correction and calibration techniques are known to improve the resolution, such as laser trimming or fuse blowing. Such post-processing techniques, however, must be performed on a part-by-part basis thereby unduly complicating and increasing cost of the manufacturing process. Also, such post-processing techniques operate under fixed conditions and do not correct for inaccuracies or changes due to temperature, aging and/or operating conditions. Integrated calibration techniques are also known and usually operate to measure error at the backend and apply a correction factor. Such calibration techniques are limited by quantization and are usually limited correction to one-half bit of resolution of the converter itself. Also, the calibration techniques are incorporated in silicon and thus subject to the same limitations of the target circuitry.

Many ADC techniques and architectures are known. Some of the early ones were used in the low resolution converters. Flash conversion is a classical technique where the input signal is compared to a reference voltage and the result is decoded into a digital word. The flash needs $2^N$ comparators where N is the number of bits of resolution. As a result, the number of comparators and the power consumption exponentially increase with higher resolution. Although some improvements have been made, practical solutions are limited to about 8 bits of resolution to achieve optimum performance.

Pipeline converters behave similarly to flash converters except that there is a finite latency between the analog sample and the digital representation of the sample, which is dependent on the number of stages in the pipeline. The matching of the elements in the converter is limited to approximately 10 bits, beyond which some calibration of the components is required in any architecture. When the resolution is increased, the input stages have to be more accurate in resolving the input signal, which results in slower conversion speeds because of the settling time of the amplifier. Time interleaving of multiple pipeline converters has been demonstrated. This technique is limited by the accuracy of the sampling interval relative to the other stages, the relative gain and offset match, and the timing jitter of the sampling clocks Successive approximation converters also allow higher resolutions but tend to be slower since they usually require N cycles to produce the answer. Sigma delta techniques allow much higher resolutions (10 to 24 bits), but are relatively slow since the requisite level resolution is achieved by oversampling the input signal and noise shaping. Folding is another high speed technique in which the signal is "folded" by using several folding amplifiers to replicate the input signal and by detecting zero crossings of the folding amplifiers to produce the digital output. Again, for higher resolution, the folding technique requires many folding amplifiers resulting in relatively high power consumption. Furthermore, the folding amplifiers must be faster by a factor that is equivalent to the folding ratio used in the converter. Higher resolution folding also requires calibration. Although interpolation, when used with folding, reduces the number of folding amplifiers, the resulting dynamic range of the converter is also limited.

SUMMARY OF THE INVENTION

An analog to digital converter (ADC) in accordance with embodiments of the present invention performs subranging and interpolation to convert an input analog signal into a stream of output digital values with a predetermined resolution. It is appreciated that an ADC according to at least one embodiment of the present invention may be implemented using a pipelined architecture with multiple sequential stages to resolve the digital value. The ADC may include, for example, a sampler that regularly samples an input analog signal and that provides a stream of sample signals to a first stage. The ADC further includes at least one secondary stage, where each secondary stage is coupled in sequential order after the first stage. The ADC also includes an error corrector or combiner that combines the digital results of the stages and generates a corresponding stream of digital values.

The first stage flash converts the stream of sample signals into corresponding primary multiple bit values and subranges a reference ladder for each primary multiple bit value into corresponding sets of reference signals. Each secondary stage is coupled in sequential order after the first stage. Each secondary stage amplifies each set of residual signals from a prior stage, interpolates each set of amplified residual signals using a resistive ladder, flash converts each set of amplified residual signals into corresponding secondary multiple bit values, and chooses the correct subrange of residual signals for each corresponding secondary multiple bit value. The final stage amplifies each set of residual signals from a prior stage and flash converts each set of amplified residual signals of the final stage into corresponding final multiple bit values.

The error corrector combines each primary multiple bit value with one or more corresponding secondary multiple bit values and a final multiple bit value into a corresponding stream of digital values representative of the analog signal. The error corrector may include an adder that adds each set of corresponding multiple bit values from most significant to least significant to determine a corresponding sum value. The error corrector further determines a corresponding digital value based on each sum value. The adder may be configured to align the most significant bit of each secondary and final multiple bit value with the least significant bit of a corresponding multiple bit value determined by an adjacent previous stage including the first stage. Also, the adder may discard at least one least significant bit of each sum value to determine a corresponding digital value.

The first stage may include a flash ladder, a first flash converter, a reference resistive ladder and first select logic. The flash ladder receives a reference voltage and provides a series of intermediate voltages. The first flash converter compares each sample signal with the series of intermediate voltages and decodes a resulting comparison into a corresponding primary multiple bit value. The reference resistive ladder receives the reference voltage and provides an interpolated series of reference voltages. The first select logic outputs a plurality of tap voltages within a selected subrange of the reference resistive ladder corresponding to each primary multiple bit value. The flash converter may include a plurality of amplifiers, a plurality of latches and a decoder. Each flash amplifier has one input coupled to a corresponding junction of the flash ladder and a second input receiving the stream of sample signals. Each latch is coupled to the output of a corresponding amplifier for latching a binary value. The decoder determines a binary transition for each sample signal and generates a corresponding primary multiple bit value indicative thereof. The first select logic and first flash converter may be collectively configured to select an overlap of tap voltages of the reference resistive ladder relative to the binary transition.

The sampler may include a first track and hold circuit that receives a clock signal, that tracks the analog signal for a first portion of the clock cycle and that holds a sample signal for the remaining portion of the clock cycle. The sampler may further include a second track and hold circuit that tracks each sample signal from the first track and hold circuit for the remaining portion of the clock cycle and that holds a second sample signal during the following portion of each clock cycle. In a practical ADC, the first track and hold circuit regularly samples the input analog signal and outputs a series of samples based on a clock signal. The clock signal is selected as approximately twice the requisite Nyquist rate for the input signal. In a specific embodiment, for example, the bandwidth of the input signal is 40 MHz and the clock signal is approximately 80 MHz. Each flash comparator uses a substantial portion of each clock cycle so that by the time the first set of preamplifiers need the sample for differential amplification, the track and hold circuit must track the input signal for the next sample. In the specific embodiment, a second track and hold circuit tracks the first sample while held by the first track and hold circuit, and then holds the sample at its output while the first circuit tracks the input signal. In this manner, the second track and hold circuit acts as a memory to maintain the sample for use by the preamplifiers.

A first secondary stage may include a plurality of first preamplifiers. Each preamplifier amplifies a difference between each second sample signal and each tap voltage of a corresponding selected subrange of the reference resistive ladder. Each secondary stage may include a plurality of preamplifiers, a resistive interpolation ladder, a flash converter and select logic. The preamplifiers are coupled to select logic of a prior stage and amplify a residual signal defined within a selected portion of a resistive ladder of the prior stage. The resistive interpolation ladder interpolates the amplified residual signals. The flash converter converts each set of amplified residual signals into a corresponding second multiple bit value. The select logic outputs a selected set of interpolated signals within a corresponding selected subrange of the resistive interpolation ladder for each corresponding second multiple bit value.

The secondary stage flash converters are configured in a similar manner as the first stage flash converter except that the amplifier inputs receive outputs from stage preamplifiers rather than a resistive ladder. A minor exception occurs when a preamplifier is completely removed for calibration in which one flash converter amplifier receives interpolated signals of an interpolation ladder driven by surrounding preamplifiers. Each amplifier and latch pair of each flash converter collectively operates as a comparator. The secondary stage select logic is configured to include an overlap for each selected portion of the resistive interpolation ladder. In one embodiment, the select logic includes a plurality of switches that select interpolative junctions between a selected sequential pair of the plurality of preamplifiers and that select an overlap including interpolative junctions on either side of the selected sequential pair. The amount of overlap may be half range on either side to ensure that the sampled signal is not lost due to comparator offsets and to provide 1 bit of digital redundancy used for digital correction.

In one embodiment, calibration circuitry is provided which calibrates the reference ladder, a first set of preamplifiers within a first secondary stage and a second set of preamplifiers within a second secondary stage. It is noted that the present invention is not limited to high accuracy converters and may be applied to converters used in most if not all ADC applications. The particular subranging, amplifying and interpolating pipeline architecture, however, facilitates accuracy especially when calibration is employed. In calibrated embodiments, the first flash ladder and each of the flash converters only need a modest level of accuracy and linearity. In the particular embodiment illustrated, calibration is performed periodically in the background and does not interrupt normal operation. The use of calibration and overlap selection ensures that signal being converted is not lost in the pipeline and provides digital redundancy for digital error correction. Digital values determined by the flash converters that appear to be incorrect are automatically corrected by the error correction circuitry using digital alignment and summation facilitated by the digital redundancy.

An ADC according to alternative embodiments of the present invention includes a track and hold circuit that samples an analog signal, a flash ladder, a first flash converter that uses the flash ladder and analog samples to generate a first set of bits, a reference resistive ladder having a plurality of tapped reference voltages, first select logic that selects a portion of the reference resistive ladder corresponding to the first set of bits, a first set of preamplifiers that amplifies a difference between each analog sample and each of the plurality of tapped voltages of the selected portion of the resistive reference ladder, a first interpolator resistive ladder that interpolates the outputs of the first set of amplifiers, a second flash converter that determines a second set of bits indicative of a zero-crossing of outputs of the first set of preamplifiers, second select logic that selects a plurality of tapped voltages within a portion of the first interpolator resistive ladder corresponding to the second set of bits, a second set of preamplifiers that amplifies a difference of each of the selected plurality of tapped voltages of the first interpolator resistive ladder, a third flash converter that determines a third set of bits indicative of a zero-crossing of outputs of the second set of preamplifiers, and a combiner that combines the first, second and third sets of bits to provide a digital value representative of the sample.

The ADC may further include a second interpolator resistive ladder that interpolates the outputs of the second set of amplifiers, third select logic that selects a plurality of tapped voltages within a portion of the second interpolator resistive ladder corresponding to the third set of bits, a third set of preamplifiers that amplifies a difference of each of the selected plurality of tapped voltages of the second interpolator resistive ladder, and a fourth flash converter that determines a fourth set of bits indicative of a zero-crossing of outputs of the third set of preamplifiers, where the combiner combines the first, second, third and fourth sets of bits to provide the digital output value representative of the sample.

The ADC may further include a third interpolator resistive ladder that interpolates the outputs of the third set of amplifiers, fourth select logic that selects a plurality of tapped voltages within a portion of the third interpolator resistive ladder corresponding to the fourth set of bits, a fourth set of preamplifiers that amplifies a difference of each of the selected plurality of tapped voltages of the third interpolator resistive ladder, and a fifth flash converter that determines a fifth set of bits indicative of a zero-crossing of outputs of the fourth set of preamplifiers, where the combiner combines the first, second, third, fourth and fifth sets of bits to provide the digital output value representative of the sample.

A method of converting an analog signal to a digital value in accordance with embodiments of the present invention includes regularly sampling the analog signal to provide a stream of sample signals, dividing a reference signal into a plurality of intermediate signals and separately into a plurality of reference signals, flash converting each sample signal with the intermediate signals to determine corresponding first binary values, selecting a subrange of the plurality of reference signals based on each first binary value, amplifying a difference between each sample signal and each reference signal of a corresponding selected subrange of reference signals to provide corresponding sets of first amplified residual signals, flash converting each set of first amplified residual signals to determine corresponding second binary values, interpolating each set of first amplified residual signals to provide corresponding sets of first interpolated signals, selecting a subrange of each set of first interpolated signals based on each second binary value, amplifying the subrange of signals of each set of first interpolated signals to provide corresponding sets of second amplified residual signals, flash converting each set of second amplified residual signals to determine corresponding third binary values, and combining corresponding sets of first, second and third binary values to generate a digital output value.

The flash converting may include comparing a plurality of differential signals, latching comparator results into a plurality of comparator values, decoding the comparator values to determine a binary transition point, and providing a binary value indicative of the transition point. The method may further include interpolating each set of second amplified residual signals to provide corresponding sets of second interpolated signals, selecting a subrange of signals of each set of second interpolated signals based on each third binary value, amplifying a subrange of signals of each set of second interpolated signals to provide corresponding sets of third amplified residual signals, and flash converting each set of third amplified residual signals to determine corresponding fourth binary values, where the combining involves combining corresponding sets of first, second, third and fourth binary values to generate the digital output value. The interpolating, selecting, amplifying and comparing may be repeated as often as necessary to provide additional sets of binary values used to generate the digital output value.

The combining may include aligning corresponding sets of binary values from most significant to least significant, and adding the aligned binary values to achieve a sum value. The aligning may include aligning the most significant bit of each next binary value with the least significant bit of a corresponding prior binary value. The method may further include discarding at least one least significant bit of the sum value to determine the output digital value.

Another method of converting an analog signal to a digital value in accordance with embodiments of the present invention includes sampling the analog signal, flash converting the analog sample with a first plurality of intermediate signals of a reference signal to determine a first binary value, dividing the reference signal to provide a plurality of accurate reference signals, subranging the plurality of accurate reference signals based on the first binary value, and amplifying a difference between the analog sample and subranged reference signals to provide amplified residual signals. The method further includes repeating each of the following flash converting, interpolating, subranging and amplifying for the analog sample to determine a sufficient number of binary values to achieve a desired resolution. The repeated steps include flash converting the amplified residual signals to determine a subsequent binary value, interpolating the amplified residual signals, subranging the amplified residual signals based on the subsequent binary value, and amplifying the subranged amplified residual signals. The method also includes combining the determined binary values to determine the digital value.

BRIEF DESCRIPTION OF THE DRAWINGS

A better understanding of the present invention can be obtained when the following detailed description of the preferred embodiment is considered in conjunction with the following drawings, in which:

FIG. 7A is a simplified schematic diagram of selected portions of the Preamps1, the ILadder1 and corresponding switches of the MUX1 of FIG. 1.

FIG. 7B is a schematic diagram similar to FIG. 7A except illustrating digital error correction in the event voltage offsets within any of the flash converters causes an erroneous digital value to be generated.

DETAILED DESCRIPTION OF EMBODIMENT (S) OF THE INVENTION

Figure 1:
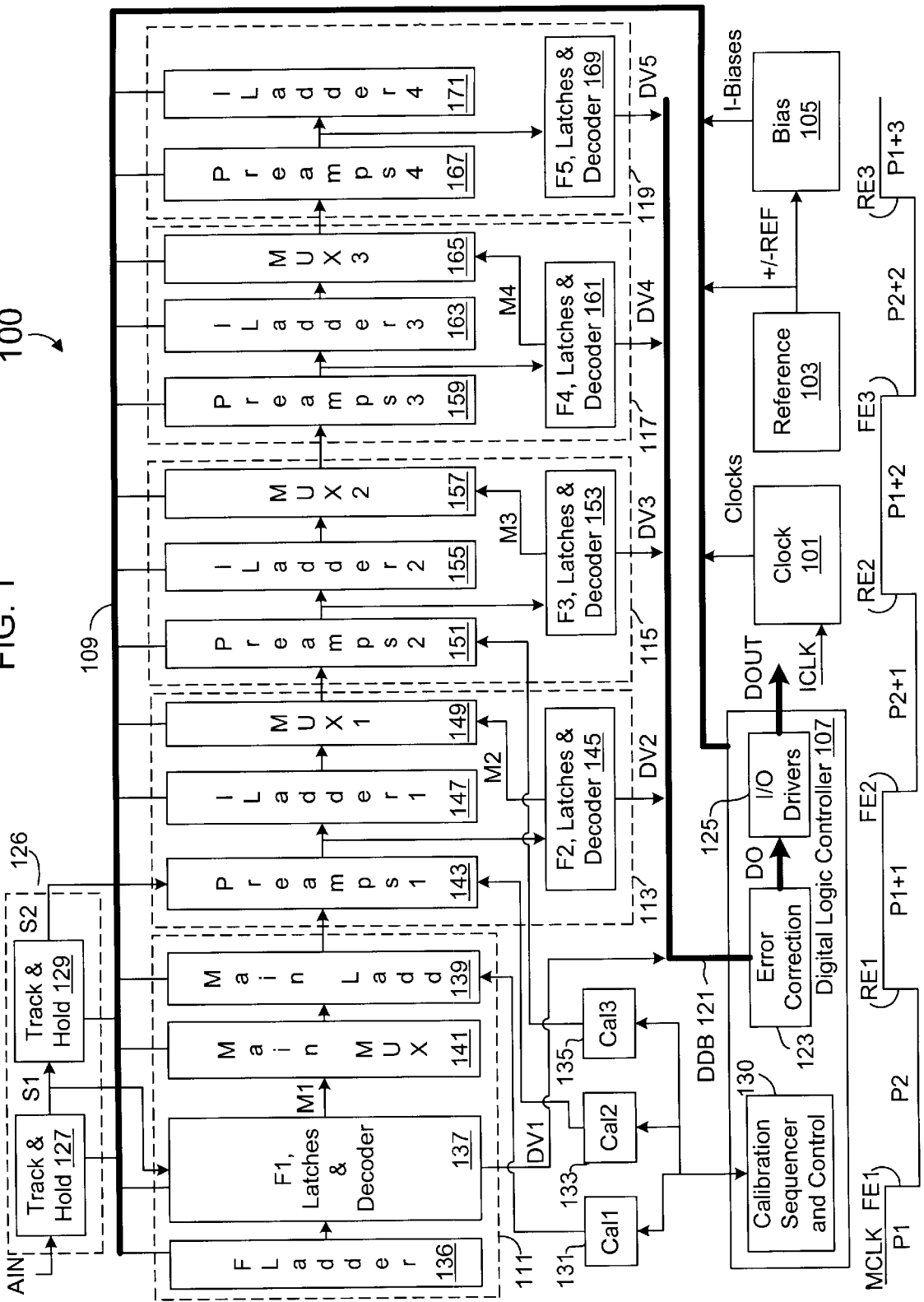
FIG. 1 is a block diagram of an exemplary analog to digital converter in accordance with an embodiment of the present invention.

FIG. 1 is a block diagram of an exemplary 14-bit analog to digital converter (ADC) 100 in accordance with an embodiment of the present invention. The ADC 100 includes support circuitry, such as a clock circuit 101, a reference circuit 103, a bias circuit 105 and a digital logic controller 107, all coupled together via a bias/clock bus 109. The clock circuit 101 receives an input clock signal ICLK and generates a plurality of clock signals "Clocks" for providing synchronization of the various components of the ADC 100. The reference circuit 103 generates reference voltage signals +REF and −REF that are sufficiently independent of temperature and power supply variations. The +/−REF signals are provided to the bias circuit 105, which develops a plurality of temperature-independent bias current signals "I-Biases" that provide current biasing for various components of the ADC 100 including preamplifiers within pipelined stages, as further described below.

The signals of the bias/clock bus 109 are distributed to other components of the ADC 100 for purposes of control, synchronization, biasing and support. The bias/clock bus 109 is not necessarily organized as a single bus but instead includes analog and digital control signals collectively shown for purposes of simplifying description without departing from the spirit and scope of the present invention. Also, many of the signals and components described herein are differential in form throughout the pipelined architecture of the ADC 100, although the principles of the present invention may be applied in a similar manner to single-ended signals and components.

In the exemplary embodiment shown, the ADC 100 is configured as a pipelined architecture with multiple stages including a first input stage 111 and one or more secondary stages 113, 115 and 117 and an output stage 119 that collectively convert a sampled analog signal, referred to as "AIN", into an output digital value. The stages are loosely defined based on a series of sequentially-coupled flash converters 137, 145, 153, 161 and 169, where each flash converter includes latches and decoders as further described below. Each of the stages 111–119 develops a corresponding 4-bit digital value DV1, DV2, DV3, DV4 and DV5, respectively, which are collectively provided to an error correction circuit 123 within the digital logic controller 107 via a 20-bit digital data bus (DDB) 121. The error correction circuit 123 converts the resulting 20-bit digital value on the DDB 121 into a 14-bit value referred to as "DO" to an input of a series of Input/Output (I/O) drivers 125. The I/O drivers 125 assert corresponding digital output signals, shown as "DOUT" signals, which are digital representations of the input analog signal AIN. The number of stages employed and the number of resolved bits per stage reflect the relative accuracy desired for the digital output. A different number of stages and/or number of resolved bits per stage may be used for different configurations or applications.

The ADC 100 includes a sample circuit 126 that regularly samples the AIN signal and that provides corresponding sample signals to the input stage 111. More particularly, the AIN signal is regularly sampled by a first track and hold circuit 127 for developing a first sample signal S1, which is provided to an input of a second track and hold circuit 129 and to an input of the first stage 111. The second track and hold circuit 129 samples the S1 signal at the same rate and asserts another sample signal S2 to an input of the second stage 113. In the exemplary embodiment illustrated, the clock circuit 101 asserts a master clock signal (MCLK) of approximately 80 MHz on the bias/clock bus 109. The MCLK signal is shown in FIG. 1 for purposes of illustration. In the embodiment shown, the track and hold circuit 127 samples the AIN signal at the MCLK rate and holds its output signal S1 at the sampled level for sampling by the track and hold circuit 129. The track and hold circuit 129 also samples the S1 signal at the MCLK rate and holds its output for use by the second stage 113. In the embodiment shown, the track and hold circuits 127, 129 operate in a make before break configuration so that the level of the S1 signal is transferred to the S2 signal. Although a single master clock signal is shown (MCLK), separate sample and hold clocks may be used to enable make before break operation. In any event, the track and hold circuit 129 operates like a memory to hold one sample of the AIN signal for additional time while another sample is being taken.

Each of the stages 111–119 includes a flash converter and at least one resistive ladder, where each flash converter includes latching comparators and a decoder. Each of the stages 111–117 includes select logic or a multiplexor (MUX) controlled by a corresponding flash converter for purposes of subranging resistive ladders. Each of the stages 113–119 includes a set of preamplifiers for amplifying selected subranges. The resistive ladders each operate as an interpolator to divide a voltage range applied at the inputs or across the resistive ladder into intermediate voltages. The applied voltage range is either a reference signal (as in the first stage 111) or a residual signal from a prior stage. The first stage 111 includes the first flash converter 137, a "flash" resistive ladder 136 (FLadder), a primary reference resistive ladder referred to as the "Main Ladder" 139 and a "Main" MUX 141 for selecting a subrange of the Main Ladder 139. The second stage 113 includes a set of preamplifiers 143 (Preamps1), the second (F2) 4-bit flash converter 145, a first interpolator resistive ladder (ILadder1) 147, and a MUX 149 (MUX1). The third stage 115 includes a set of preamplifiers 151 (Preamps2), the third (F3) 4-bit flash converter 153, a second interpolator resistive ladder (ILadder2) 155 and another MUX 157 (MUX2). The fourth stage 117 includes a set of preamplifiers 159 (Preamps3), the fourth 4-bit flash converter 161, a third interpolator resistive ladder 163 (ILadder3) and another MUX 165 (MUX3). The fifth and final stage 119 includes a set of preamplifiers 167 (Preamps4), the fifth (F5) 4-bit flash converter 169 and a fourth interpolator resistive ladder 171 (ILladder4). Although the ladders 147, 155, 163 and 171 are referred to as "interpolator" ladders referencing the interpolator function, each performs an additional function of averaging the voltage outputs of the preamplifiers 143, 151, 159 and 167, respectively, and thereby reducing any amplifier offsets. Also, the final ILadder4 171 does not necessarily need to perform the interpolator function since at the end of the pipeline.

Selected components of the ADC 100 must be at least as accurate as the intended resolution of the ADC 100. In the particular embodiment shown, for example, the ADC 100 is a 14-bit converter, so that the track and hold circuits 127, 129 each have at least 14-bit accuracy. The Main Ladder 139 receives the +/-REF signal and develops a stack of intermediate reference voltage levels and is accurate to at least 14 bits in the embodiment shown. A calibration circuit 131 is provided for periodically calibrating the Main Ladder 139 to achieve and maintain the requisite accuracy. Calibration circuits 133 and 135 are provided for periodically calibrating the preamplifiers 143 and 151 to achieve and maintain the requisite 14-bit accuracy. It is desired that remaining components have a relative or requisite degree of accuracy depending upon their functionality, design criterion and overall impact on the digital output value DOUT. The flash ladder 136, for example, has a relatively loose linearity requirement due to digital error correction and resolves only 4 bits at a time. The resistors of the flash ladder 136 and the flash converter 137 are designed to meet a speed specification (~80 MS/s) rather than accuracy. The flash converter 137 also only needs sufficient accuracy to resolve the 4 most significant bits and to select the appropriate subrange of the Main Ladder 139. Also, each of the flash converters 145, 153, 161 and 169 need only resolve 4 bits at a time. The digital logic controller 107 includes a calibration sequencer and control circuit 130 for controlling operation of the calibration circuits 131, 133 and 135. It is understood that each stage may be narrowed or widened to resolve less or more bits, respectively, for different applications.

In the exemplary embodiment shown, each of the five flash converters 137, 145, 153, 161 and 169 contribute a respective 4-bit digital or binary value, shown as DV1, DV2, DV3, DV4 and DV5, respectively, ranging from most significant to least significant, to the 20-bit DDB 121. In particular, the DDB 121 includes bit signals DDB(20 . . . 1) with DDB(20) being the most significant bit (MSB). The flash converter 137 provides DV1 as the MSB's DDB[20 . . . 17], the flash converter 145 contributes DV2 as the next bits DDB[16 . . . 13], the flash converter 153 contributes DV3 as the next bits DDB[12 . . . 9], the flash converter 161 contributes DV4 as the next bits DDB[8 . . . 5], and the flash converter 169 contributes DV5 as the least significant bits (LSB) DDB[4 . . . 1] of the DDB 121. The error correction circuit 123 regularly combines the 20 bits of the DDB 121 to generate the 14-bit DO value as further described below. The flash converters 137, 145, 153 and 161 each asserts a corresponding MUX select value M1, M2, M3 and M4, respectively, to the Main Mux 141, the MUX1 149, the MUX2 157 and the MUX3 165, respectively, for subranging the Main Ladder 139, the ILadder1 147, the ILadder2 155 and the ILadder3 163, respectively. The digital select values M1–M4 are related to the digital values DV1–DV4 according to a selected one of a number of possible coding schemes known to those skilled in the art. The format of the digital select values M1–M4 is chosen for the particular configuration and operation of the respective muxes, as further described below.

The flash ladder 136 comprises a fully differential resistor ladder using the +/-REF signals at either end to develop a sequential and differential stack of reference voltages. Each flash converter 137, 145, 153, 161 and 169 comprises a stack of comparators, each comparator consisting of a preamplifier and regenerative latch. During a first MCLK time period P1, the track and hold circuit 127 tracks the AIN signal. At a first falling edge (FE1) of the MCLK signal, the track and hold circuit 127 holds the S1 sampled signal to the flash converter 137. During the following MCLK period P2 between FE1 and the next rising edge of the MCLK signal (RE1), the flash converter 137 compares the S1 signal with each of the stack of reference voltages of the flash ladder 136. At the end of the MCLK period P2 at RE1, the flash converter 137 latches the flash preamplifier outputs and decodes the first 4-bit digital value DV1 representing the relative level of the S1 signal between the +/-REF signals. Since the S1 signal is expected to be within the +/-REF signal range and each flash preamplifier compares a corresponding interpolated reference signal with S1, the F1 flash converter 137 effectively decodes a transition point of the S1 signal in the range of the flash ladder 136.

The M1 value is provided to the Main MUX 141. At the next falling edge of the MCLK signal (FE2) beginning an MCLK period P1+1 between RE1 and FE2, the Main MUX 141 selects a subrange portion of the Main Ladder 139. The selected portion of the Main Ladder 139 includes sufficient overlap, as further described below, to ensure that the sampled signal is contained within the selected range and to provide digital redundancy for digital error correction. The Main Ladder 139 also receives the +/-REF signals at either end and comprises a series of primary resistors forming a resistor string, where each primary resistor is further divided by a subladder of resistors. In this manner, the +/-REF signals are finely divided into a sequential series of intermediate reference voltages by the Main Ladder 139. The Main MUX 141 comprises a switch matrix coupled to each of the subladder elements of the Main Ladder 139, and applies the selected portion or residual signal across first inputs of the Preamps1 143 during the P1+1 period. Meanwhile, the track and hold circuit 129 tracks the S1 signal during the MCLK period P2 and holds the S2 signal at the level of the S1 signal until FE2. The S2 signal, being a delayed equivalent of the originally sampled AIN signal, is applied to second inputs of the Preamps1 143. The Preamps1 143 comprise a stack of amplifiers having a predetermined gain for amplifying the differential between the S2 signal and a corresponding voltage level within the selected subrange of reference voltages the Main Ladder 139.

During the MCLK period P1+1, the amplified residual signal from the Preamps1 143 is applied across the ILadder1

147 and to the inputs of the F2 flash converter 145. The ILadder1 147 interpolates the amplified residual signal, and the F2 flash converter 145 makes a digital decision based on the amplified residual signal to determine the second digital value DV2. The decode of the F2 flash converter 145 is similar to the decode performed by the F1 flash converter 137, and is based on a zero crossing point within the range of the ILadder1 147. At the next falling edge of the MCLK signal (FE2) beginning an MCLK period P2+1 between FE2 and the next rising edge (RE2), the F2 flash converter 145 latches the DV2 value, which is asserted on the DDB 121. The F2 flash converter 145 provides the M2 signal to the MUX1 149, where the M2 signal reflects the DV2 value. The MUX1 149 comprises a bank of switches coupled to the interpolation resistors of the ILadder1 147. During the P2+1 MCLK period, the MUX1 149 selects a portion of the ILadder1 147 and provides the selected portion across the inputs of the Preamps2 151. The M2 signal and the MUX1 149 are configured in such a manner that allows selection of an error correction band of approximately half the interpolation range on either side of the selected portion of the ILadder1 147. Although operation of the Preamps2 151 is similar to operation of the Preamps1 143, the Preamps2 151 do not amplify based on reference signals but instead amplifies the differential output voltages of the selected portion of the ILadder1 147.

During the P2+1 MCLK period, The ILadder2 155 interpolates the amplified residual signal from the Preamps2 151, and the F3 flash converter 153 makes a digital decision based on the residual signal to determine the third digital value DV3 and the M3 value. The decode of the F3 flash converter 153 is similar to the F2 flash converter 145 based on a zero crossing point within the range of the ILadder2 155. At RE2 beginning an MCLK period P1+2 between RE2 and the next falling edge (FE3), the F3 flash converter 153 latches the DV3 value on the DDB 121 and generates the M3 value, which is provided to the MUX2 157. The MUX2 157 also comprises a bank of switches which are coupled to the interpolation resistors of the ILadder2 155, and the M3 value and MUX2 157 are configured to select an error correction band of approximately half the interpolation range on either side of the selected portion of the ILadder2 155. During the P2+1 MCLK period, the MUX2 157 selects a portion of the ILadder2 155 and provides the selected portion across the inputs of the Preamps3 159. The Preamps3 159 amplify the differential outputs of the selected portion of the ILadder2 155.

Configuration and operation of the next stage 117 is similar to the stage 115, where the ILadder3 163 interpolates the amplified residual signal from the Preamps3 159, and the F4 flash converter 161 makes a digital decision based on the residual signal to determine the fourth digital value DV4 and the M4 value. At FE3 beginning an MCLK period P2+2 between FE3 and the next rising edge (RE3), the F4 flash converter 161 latches the DV4 value, provides the M4 value to the MUX3 165 and asserted on the DDB 121. The MUX3 165 selects a portion of the ILadder3 163 and provides the selected portion across the inputs of the Preamps4 167, which amplify the differential outputs of the selected portion of the ILadder3 163.

In the final stage 119, the ILadder4 171 receives the amplified residual signal from the Preamps4 167. The ILadder4 171, however, does not include interpolation switches since the end of the pipeline has been reached, although it performs the averaging function for the Preamps4 167 as previously described. The F5 flash converter 169 makes a digital decision based on the residual signal to determine the fifth digital value DV5, which is latched onto the DDB 121 at RE3. At FE2, the track and hold circuit 127 holds the next sample on the S1 signal provided to the flash converter 137. At RE2, the flash converter 137 latches and decodes the next 4-bit digital value DV1 as the first digital value of the next sample of the AIN signal. Operation proceeds in this manner so that the error correction circuit 123 receives a completely new set of digital values DV1–DV5 at the next rising edge (not shown) of MCLK after RE3. In this manner, a new set of digital values is received by the error correction circuit 123 after each subsequent rising edge of the MCLK signal. New samples are continuously propagated in a synchronous manner at the sampling rate through the stages 111–119 so that the DOUT value tracks the AIN signal. A relatively insignificant delay of 3 MCLK cycles initially occurs to fill the stages of the pipeline, so that the DOUT signal is the digital representation of the AIN signal with a latency of 3 clock cycles.

Figure 2:
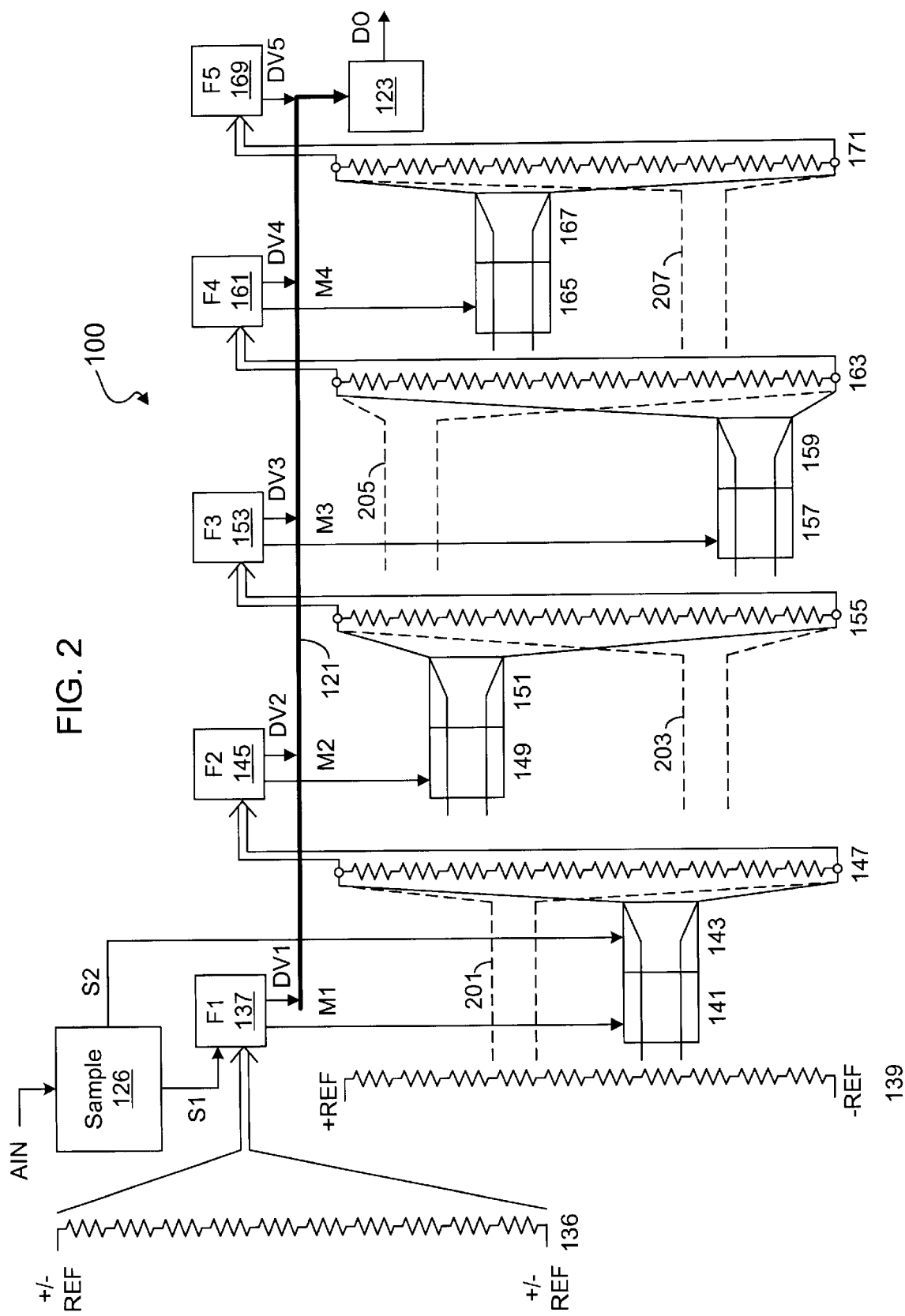
FIG. 2 is a simplified schematic and block diagram generally illustrating the subranging, amplification and interpolation operation of the ADC of FIG. 1.

FIG. 2 is a simplified schematic diagram generally illustrating the subranging, amplification and interpolation operation of the ADC 100. The illustration is shown in single-ended format for clarity of explanation where it is understood that the ADC 100 operates in full differential mode. The flash ladder 136 is referenced to the +/−REF signals and serves as the flash ladder for the F1 flash converter 137. The S1 sample of the AIN signal is provided from the sample circuit 126 to the F1 flash converter 137, which compares S1 to the reference signals to decode the DV1 value and the M1 value. The M1 value is provided to the Main MUX 141, which selects a corresponding subrange of the Main Ladder 139 also referenced to the +/−REF signals. The selected subrange of the Main Ladder 139 is provided to the preamplifiers 143, which amplify the residual signal between the selected tap voltages and the S2 sample. The subrange selection and amplification is fully differential and includes a mirrored differential portion shown at 201. The amplified residual signal is applied across the ILadder1 147, which interpolates the amplified residual signal and serves as a flash ladder for the F2 flash converter 145. The F2 flash converter 145 decodes the DV2 and M2 values based on a zero-crossing point of the ILadder1 147, where the M2 value is used by the MUX1 149 to select a corresponding subrange of the ILadder1 147. The selected subrange voltage taps of the ILadder1 147 are provided to the preamplifiers 151, which amplify the differential output voltages of the selected portion of the ILadder1 147 and apply the amplified residual signals to the ILadder2 155. A mirrored differential portion shown at 203 is included.

Operation is similar for the remaining components of the ADC 100. The resistive ladders 155, 163 and 171 operate as flash ladders for the F3, F4 and F5 flash converters, respectively. The F3, F4 and F5 flash converters each decode based on the respective amplified residual signals for determining the respective DV3, DV4 and DV5 digital values and the M3 and M4 values. The MUXs 157 and 165 use the M3 and M4 digital values to subrange the ladders 155 and 165, respectively. The preamplifiers 159 and 167 amplify the subrange tap voltages and apply the respective amplified residual signals to the resistive ladders 163 and 171 respectively. Mirrored differential portions shown at 205 and 207 are included in the respective stages. The final resistive ladder 171 does not include interpolation switches since further interpolation is not needed to achieve the desired output value. The error correction circuit 123 uses the digital values DV1–5 to generate the DO value as described further below.

Figure 3:
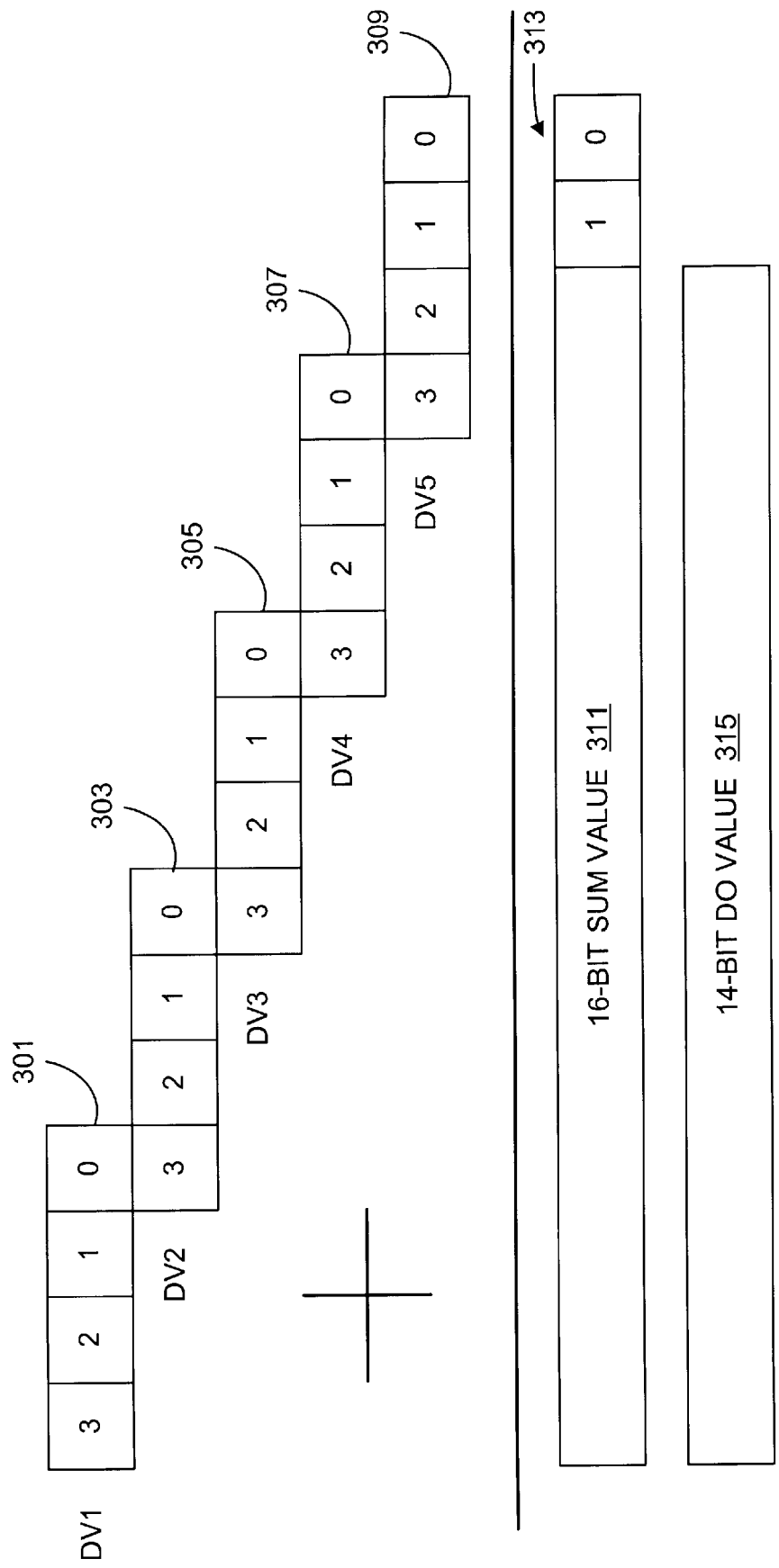
FIG. 3 is a figurative block diagram illustrating an exemplary operation of the error correction circuit of FIG. 1 to combine partial and preliminary digital values to resolve the output digital values.

FIG. 3 is a figurative block diagram illustrating an exemplary operation of the error correction circuit 123 that aligns and combines the DV1–DV5 values. The four bits, labeled 3, 2, 1 and 0, respectively, of each of the digital values DV1, DV2, DV3, DV4 and DV5, as shown at 301, 303, 305, 307 and 309, respectively, are added together to result in a 16-bit sum value as shown at 311. In particular, the 0 bit of DV1 is aligned with the fourth (3) bit of DV2, the 0 bit of DV2 is aligned with the fourth (3) bit of DV3, the 0 bit of DV3 is aligned with the fourth (3) bit of DV4, and the 0 bit of DV4 is aligned with the fourth (3) bit of DV5 and the addition is performed. The last two least significant (and least accurate) bits, shown at 313, of the resultant 16-bit sum value 311 are discarded, resulting in the final 14-bit DO value 315. The DO value 315 is provided to the inputs of the I/O buffers/drivers 125, which assert the DOUT value.

In the exemplary embodiment shown, the digital logic controller 107 and/or the error correction circuit 123 includes appropriate buffer and/or latch circuitry and memory (not shown) to store associated digital values DV1–DV5 for each MCLK cycle. During the first operative clock cycle after initialization, a first valid DV1 value is asserted on the DDB 121 and is stored. In the second clock cycle, a first DV2 value corresponding to the first DV1 value is valid and a second, new DV1 value replaces the first DV1 value on the DDB 121. The new DV1 and DV2 values are stored and the new DV2 value is associated with the first DV1 value. Subsequently, in the third clock cycle, the DDB 121 includes a third DV1 value, a second DV2 value and a first DV3 value. The first DV1, DV2 and DV3 values are stored together or otherwise associated with each other and the second DV1 and DV2 are stored together or otherwise associated with each other. Operation proceeds in this manner so that the first occurrences of DV1–DV5 are stored together or otherwise associated with each other, the second occurrences of DV1–DV5 are stored together or otherwise associated, etc. Upon completion of each set, the error correction circuit 123 performs the alignment and addition of associated values and outputs a new DO signal for every MCLK cycle.

Figure 4:
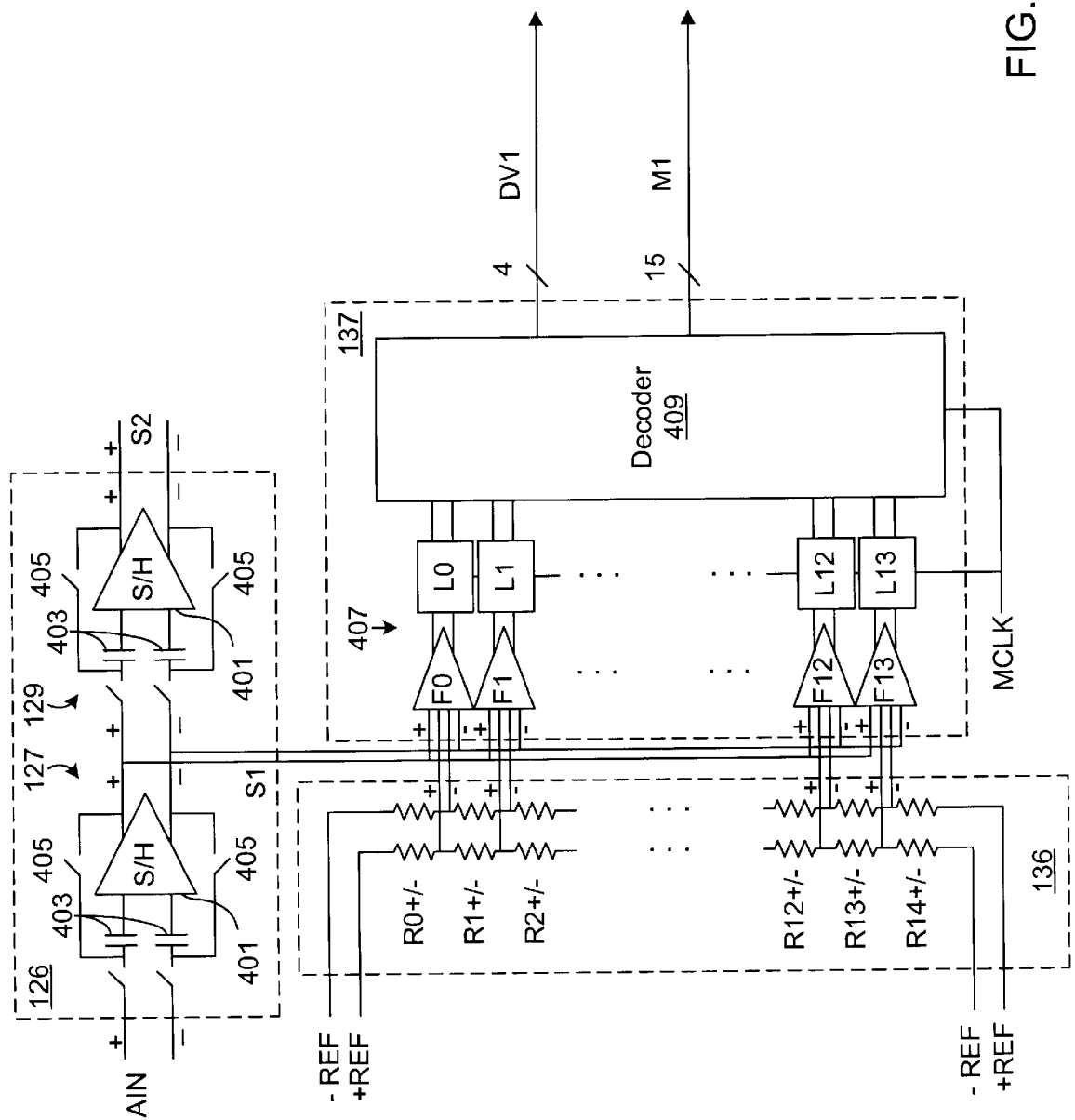
FIG. 4 is a more detailed schematic diagram of an exemplary embodiment of the sample circuit, the Flash ladder (FLadder) and the F1 flash converter of FIG. 1.

FIG. 4 is a more detailed schematic diagram of an exemplary embodiment of the sample circuit 126, the flash ladder 136 and the flash converter 137. Each of the track and hold circuits 127 and 128 are configured in a substantially identical manner and are shown in simplified form, each including an operational amplifier (op-amp) 401, a pair of sampling capacitors 403, each sampling capacitor coupled to a respective one of the positive and negative input terminals of the op-amp 401, and a pair of sampling switches 405 coupled in feedback mode including a first switch coupled between the positive capacitor and positive output terminal and a second switch coupled to the negative capacitor and negative output terminal. The positive and negative output terminals of the op-amp 401 of the track and hold circuit 127 develop the differential S1 signal and are coupled to the positive and negative input terminals, respectively, of the op-amp 401 of the of the track and hold circuit 129. The AIN signal is a differential signal provided across the positive and negative inputs of the track and hold circuit 127 and the positive and negative outputs of the track and hold circuit 129 develop the differential S2 signal. As described previously, the track and hold circuits 127 and 129 operate according to the make before break function to hold samples of the AIN signal for an additional time. It is appreciated that many different sample or tracking circuits as known to those skilled in the art may be used instead of the particular configuration illustrated.

In the embodiment shown, the sampled signals S1 and S2 are maintained at a sufficiently high degree of linearity to achieve better than 14-bit accuracy during the sampling process. A charge pump circuit (not shown) associated with an input sampling switch for each track and hold circuit maintains the linearity requirement by linearizing the sampling switch, which is achieved by maintaining constant voltage (and therefore constant resistance) across the switch under various signal conditions. Such technique of sampling in which only the switch and the capacitor are performing the sampling process is classified as open loop sampling, which achieves the highest bandwidth at the input limited only by the time constant of the switch and capacitor combination. Further details are beyond the scope of the present disclosure. It is appreciated that any suitable sampling technique may be employed depending upon the level of accuracy desired in particular configurations.

The flash ladder 136 is configured in fully differential form including a first resistive ladder having a predetermined polarity and a reverse or flipped polarity resistive ladder, each resistive ladder including 15 operative resistors coupled in a series between the +REF signal and the –REF signal. In particular, a first resistive ladder includes resistors R0+, R1+, . . . , R14+ coupled in series between the +/–REF signals in which the –REF signal is coupled to R14+ and the +REF signal is coupled to R0+. A flipped polarity resistive ladder includes resistors R0–, R1–, . . . , R14– coupled in series in which the –REF signal is coupled to R0– and the +REF signal is coupled to R14–. Such configuration establishes 14 intermediate differential nodes at the respective junctions between each complementary pair of resistors of the dual ladder configuration. Each of the resistors R0+/– to R15+/– have a nominally equal value to divide the reference voltages +/–REF into successive intermediate values at the intermediate differential nodes having a nominally constant differential voltage step size.

The flash converter 137 includes 14 comparators 407, each including input sampling capacitors (not shown), a preamplifier (F) and a latch (L). The 14 preamplifiers are individually labeled F0–F13, and each includes a pair of differential inputs. A first differential input of each preamplifier receives the S1 signal and a second differential input is coupled to a respective differential junction of the flash ladder 136. In particular, the first preamplifier F0 is coupled to the differential junction between the resistors R0+/– and R1+/–, the second preamplifier F1 is coupled to the differential junction between the resistors R1+/– and R2+/–, and so on. The 14 latches, individually labeled L0–L13, each have a differential input coupled to respective outputs of the preamplifiers F0–F13. The latches assert differential outputs to a decoder 409. Each of the preamplifiers F0–F13 amplifies a difference between the sample signal S1 and the intermediate differential voltage at the corresponding junction of the flash ladder 136. In one embodiment, the latches L0–L13 comprise simple cross-coupled dynamic latches, where each latch resolves to one of two stable states upon activation at the rising edge of the MCLK signal.

The magnitude of the AIN signal is expected to be within the voltage range of +/–REF. If AIN has a voltage greater than the intermediate voltage between resistors R0+/– and R1+/– or less than the intermediate voltage between resistors R13+/– and R14+/–, then one or more consecutive latches L0–L13 output a binary one (1) value and the remaining latches output a binary zero (0) value. Given the outside overlapping resistors R0+/– and R14+/–, it is possible that all of the latches L0–L13 output 0*b* or 1*b* (where the "b" indicates a binary value). In this manner, the collective latches L0–L13 have 15 possible states ranging between all binary 0's to all binary 1's. The decoder 409 asserts the 4-bit binary DV1 value ranging between 0000b to 1110b reflective of the number of latches that output binary 1's, which further represents the relative value of AIN with respect to the +/−REF voltage range with at least 3 bits of accuracy. The decoder 409 also asserts the M1 value having 15 different select lines M1(0)–M1(14) for selecting a subrange of the Main Ladder 139. The details of operation of the M1 value are described further below.

The decoder 409 may be implemented in any desired manner as known to those skilled in the art, such as one or more levels of stacks of logic gates to identify the transition point. For example, a configuration including a first stack of two-input NOR gates, each having its inputs coupled to inverting or non-inverting outputs of the comparators 407, and its output coupled to a corresponding input of a second layer of OR logic gates, may be used to resolve the binary state of the comparators 407 and the DV1 value. Another logic circuit may be provided to develop the M1 value directly from the outputs of the comparators 407 or indirectly from the latched value of DV1.

Figure 5:
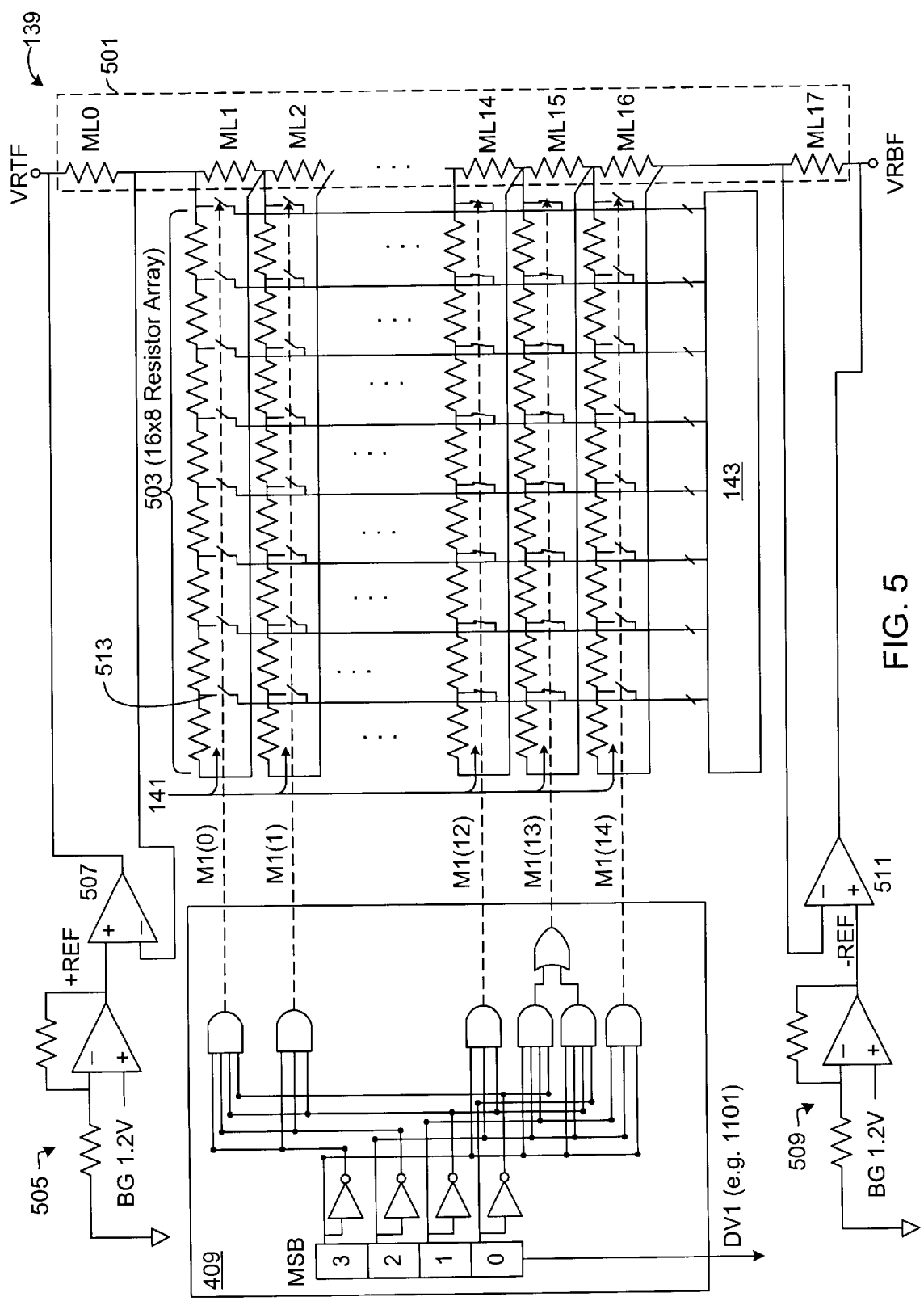
FIG. 5 is a more detailed schematic diagram illustrating interconnection between and partial configuration of the reference circuit, the Main ladder, the MUX1, the Preamps1 and the decoder of the F1 flash decoder of FIG. 1.

FIG. 5 is a more detailed schematic diagram illustrating interconnection between and partial configuration of the reference circuit 103, the Main ladder 139, the MUX1 141, the Preamps1 143 and the decoder 409 of the F1 flash decoder 137. The Main ladder 139 includes a primary resistor ladder 501, which includes 18 coarse resistors ML0–ML17 connected in series between reference voltages VRTF and VRBF. Each of the resistors ML0–ML17 have approximately equal resistance and a junction is located between each pair of resistors. The outer two resistors ML0 and ML17 are "dummy" resistors coupled to a force and sense circuit to avoid parasitic resistance and to help maintain linearity of the Main Ladder 139 in the configuration shown. In particular, the force and sense circuit eliminates variances of parasitic resistance and thus eliminates undesirable voltage variations throughout the resistive ladder. The reference circuit 103 includes an internal bandgap bias circuit (not shown) and first and second feedback amplifier circuits 505 and 509, where a temperature-independent reference bandgap voltage is applied to the feedback amplifier circuits 505 and 509. The first feedback amplifier circuit 505 develops the +REF signal and the second feedback amplifier circuit 509 develops the −REF signal. The +REF signal is provided to the non-inverting input of an op-amp 507, having its output coupled to the outer side of the resistor ML0 of the resistor ladder 501 forming the voltage node VRTF. The other side of the resistor ML0 is coupled to one side of the next resistor ML1 in the ladder and to the inverting input of the op-amp 507. In a similar manner, the −REF signal is provided to the non-inverting input of an op-amp 511, having its output coupled to the outer side of the resistor ML17 of the resistor ladder 501 forming the voltage node VRBF. The other side of the resistor ML17 is coupled to one side of the next resistor ML16 in the ladder and to the inverting input of the op-amp 511. In this manner, the +/−REF voltages are maintained across the inner 16 resistors ML1–ML16 of the resistor ladder 501. Also, since the resistors have relatively equal resistance, the +/−REF voltage is effectively subdivided into 15 intermediate voltage levels with approximately equal step size between each successive junction.

The Main Ladder 139 also includes a 16×8 resistor array 503 coupled to the resistor ladder 501, where each resistor in the resistor array 503 has an approximately equal resistance. In particular, the resistor array 503 includes 16 sets of 8 series-coupled resistors, where each resistor set is coupled in parallel with a corresponding one of the main resistors ML1–ML16. Thus, a first 8 resistors are connected in series and the series combination is coupled in parallel with the resistor ML1, a second 8 resistors are connected in series and the series combination is coupled in parallel with the resistor ML2, and so on. Each group of 8 resistors provides 7 intermediate junctions, so that each voltage across each of the main resistors ML1–ML16 is further sub-divided to include 7 intermediate voltage levels with approximately equal step size between each successive junction. In this manner, the +/−REF reference voltage is effectively subdivided into 128 different voltage levels for purposes of comparison with the S1 signal for purposes of flash conversion, subranging, amplification of the selected subrange, and interpolation. The calibration circuit 131 is coupled to the Main Ladder 139 and the digital logic controller 107 for period measurement and calibration to maintain the requisite linearity and accuracy.

The MUX1 141 comprises a switch array including at least one normally-open switch coupled to each operative junction of the Main Ladder 139, including the junctions between each main resistor ML1–ML16 and each sub-junction between each resistor of each group of 8 resistors of the resistor array 503. An exemplary normally-open switch 513 is referenced in the Figure, where each switch is configured in substantially identical manner. Although the simplified illustration shows multiple switches across the array coupled together, it is understood that each individual switch provides a separate signal to the Preamps1 143 so that each vertical signal line into the Preamps1 143 represents multiple signals. Although each switch is illustrated as a single switch, in one configuration each switch may include up to four separate switches since the Main Ladder 139 is intended to be operated in a fully differential configuration. For every switch shown that is "activated" or closed to provide a signal to the Preamps1 143, an opposite or mirror switch in the ladder is also activated to provide a differential signal. Although any two switches may be "reversed" for the opposite polarity signal, such would require additional logic to resolve the switching process, which would further require additional time thereby potentially slowing down the switching process. Instead, an additional pair of switches is provided at each junction to handle the opposite polarity differential signal. In this manner, there are a total of four switches at each junction to achieve a fully-differential resistor ladder configuration.

Each switch of the MUX1 141 is controlled by a corresponding one of the M1(0)–M1(14) signals asserted by the decoder 409 of the F1 flash converter 137. As shown, each of the M1 signals controls the eight switches coupled to the intermediate junctions of the resistor array 503 and between a corresponding two resistors of the resistor ladder 501. As described previously, the decoder 409 determines the 4-bit DV1 value, where each bit is shown within the decoder as bits 3, 2, 1 and 0 in which bit number 3 is the MSB. For each DV1 binary value, the decoder 409 also asserts two consecutive M1 signals corresponding to two consecutive resistors of the resistors ML1–ML16 of the resistor ladder 501 to achieve sufficient overlap manner. In particular, the decoder 409 asserts the first and second M1 signals M1(0) and M1(1) for a DV1 value of 0000b, the decoder 409 asserts the second and third M1 signals M1(1) and M1(2) for a DV1 value of 0001b, the decoder 409 asserts the third and fourth M1 signals M1(2) and M1(3) for a DV1 value of 0010b, and so on up to a DV1 value of 1110b, in which the decoder 409 asserts the last two M1 signals M1(13) and M1(14). A simplified logic circuit is shown within the decoder 409 to represent the logical operation based on the DV1 value.

Each M1 signal activates 16 switches, including the 8 switches aligned with the corresponding resistor of the resistor ladder 501 and another set of 8 mirror switches to develop 8 differential signals (not shown). Since two M1 signals are asserted at a time, 16 differential signals are provided to the Preamps1 143 for each DV1 value.

The exemplary configuration shown illustrates operation for DV1=1101b in which the M1(13) and M1(14) signals are asserted. The MUX1 141 correspondingly activates or otherwise closes the respective switches to connect the seven junctions associated with the resistor ML14, the seven junctions associated with the resistor ML15, the junction between the resistors ML14 and ML15 and the junction between the resistors ML15 and ML16 to the Preamps1 143 for a total of 16 junctions (single-ended). Note that the junction between the resistors ML13 and ML14 is not connected. Of course, an additional 16 junctions are asserted to achieve differential signals as previously described.

Figure 6:
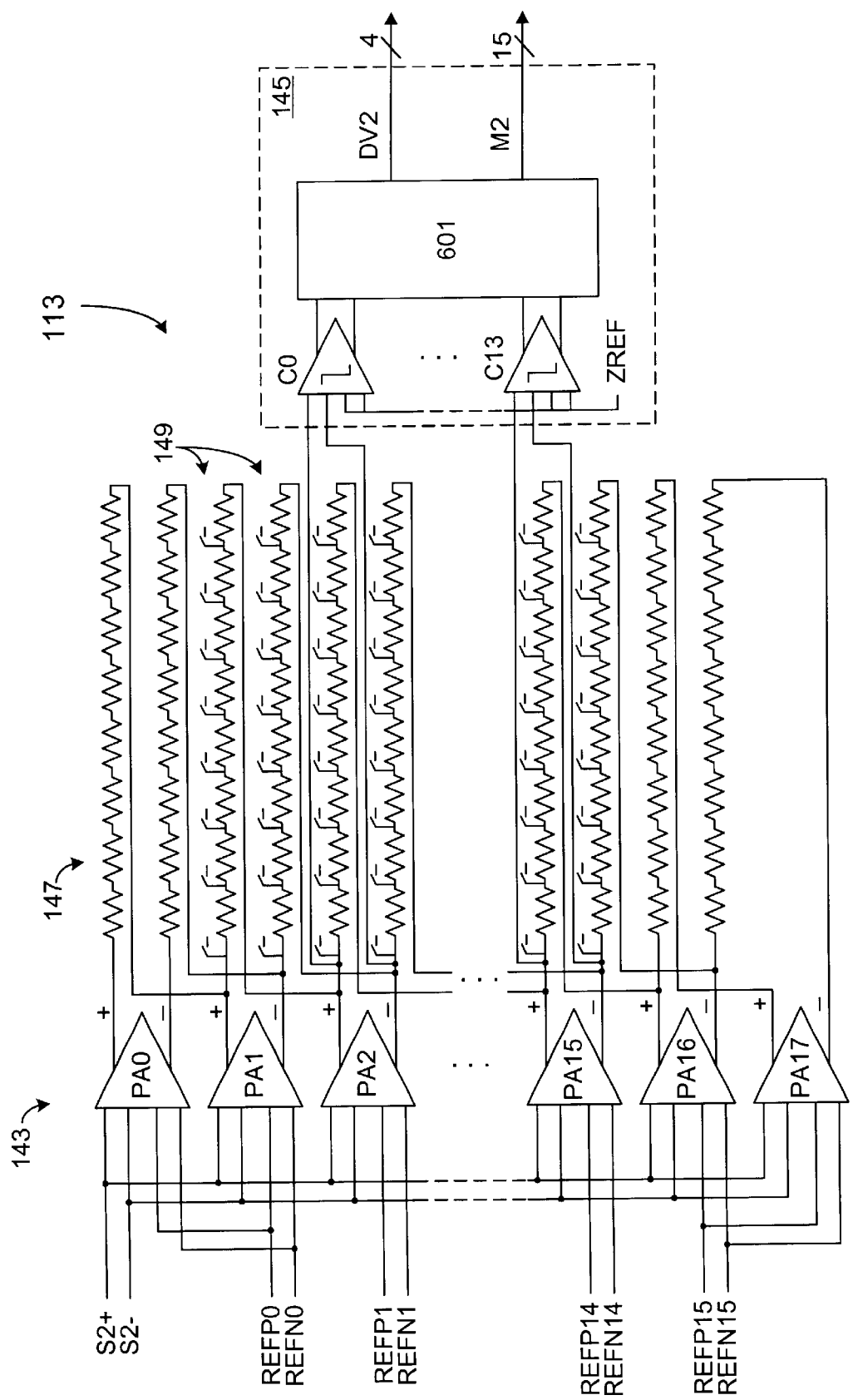
FIG. 6 is a more detailed schematic diagram of the second stage including further detail of and interconnection between the Preamps1, the F2 flash converter, the ILadder1 and the MUX1 of FIG. 1.

FIG. 6 is a more detailed schematic diagram of the stage 113 including further detail of and interconnection between the Preamps1 143, the F2 flash converter 145, the ILadder1 147 and the MUX1 149. The positive and negative polarities of the S2 signal (S2+/−) are provided to a differential input of each of the preamplifiers, shown as PA0–PA17, of the Preamps1 143. Each of the 16 differential signals from the selected portion of the Main Ladder 139 are provided to the other differential input of a respective one of the preamplifiers PA0–PA17. The Main Ladder 139 intermediate reference signals are shown as REFPx/REFNx, in which "P" denotes positive polarity, "N" denotes negative polarity and "x" is a signal index varying between 0 and 15. The REFP0/REFN0 signal is provided to the preamplifier PA1, the REFP1/REFN1 signal is provided to the preamplifier PA2, and so on. In this manner, the Preamps1 143 amplify the differential between the S2 signal and each of the selected intermediate reference signals of the selected portion of the Main Ladder 139. The Preamps1 143 include two additional or "redundant" preamplifiers PA0 and PA17 located on opposite ends of the array of preamplifiers PA1–PA16 for purposes of calibration as further described below. The additional preamplifier PA0 receives the same inputs as the preamplifier PA1 (S2 and REFP0/REFN0) and the additional preamplifier PA17 receives the same inputs as the preamplifier PA17 (S2 and REFP15/REFN15).

The ILadder1 147 includes a first polarity resistor ladder and a reverse polarity resistor ladder, where each includes 136 resistors coupled in a series configuration and where all the resistors have approximately the same resistance. The positive polarity ladder includes 17 groups of 8 resistors each, where each group of 8 resistors is coupled between the positive output terminals of a respective adjacent pair of the preamplifiers PA0–PA17. Likewise, the reverse polarity ladder includes 17 groups of 8 resistors each, where each group of 8 resistors is coupled between the negative output terminals of a respective adjacent pair of the preamplifiers PA0–PA17. In this manner, the differential outputs of the preamplifiers PA0–PA17 are interpolated into intermediate voltage levels by the ILadder1 147.

During operation, the calibration sequencer and control circuit 130 in conjunction with the calibration circuit 133 conducts a separate and independent calibration of each of the preamplifiers PA1–PA16 of the Preamps1 143. The calibration process is repeated for each of the preamplifiers PA1–PA16 in which the calibration process effectively cycles through the preamplifiers one at a time. The calibration circuitry takes the preamplifier being calibrated "out of the loop" by completely disconnecting that preamplifier. In particular, the inputs of the preamplifier being calibrated are blocked from receiving input signals and its outputs are disconnected from the ILadder1 147. Such removal, however, has minimal effect on the operation of the ADC 100 since the surrounding preamplifiers on either side of the removed preamplifier supply the voltages to the resistors of the ILadder1 147. In this manner, the voltages across the intermediate resistors of the missing preamplifier are provided by interpolation. For example, when the preamplifier PA6 is removed for calibration, the preamplifiers PA5 and PA7 drive the resistors between them to the appropriate voltage levels by interpolation. This is also true during calibration of the preamplifiers PA1 or PA16 because of the additional surrounding preamplifiers PA0 and PA17, respectively. For example, the preamplifiers PA0 and PA2 drive the intermediate resistors of the ILadder1 147 between them during calibration of the temporarily removed preamplifier PA1.

The differential outputs of the middle 14 preamplifiers PA2–PA15 are provided to corresponding differential inputs of comparators C0–C13, respectively, of the F2 flash converter 145. An exception to this occurs when a preamplifier is removed for calibration in which the corresponding resistors of the ILadder1 147 supply the interpolated voltages as previously described. The comparators C0–C13 of the F2 flash converter 145 are configured in substantially the same manner as the comparators 407 of the F1 flash ladder 137, where each comparator includes a preamplifier and latch combination as previously described. For the F2 flash ladder 145, however, one differential input of each of the comparators C0–C13 receives a zero reference signal ZREF rather than the S1 signal. Operation of the F2 flash converter 145 is substantially the same as the F1 flash converter 137 except that comparison is made with the ZREF signal rather than with the S1 signal. The F2 flash converter 145 includes a decoder 601 that resolves a zero crossing point within the amplified residual signal from the Preamps1 143 and asserts the DV2 digital value and the M2 value both indicative of the zero crossing point. The M2 signal is fed back to activate selected ones of a plurality of switches of the MUX1 149. The switches of the MUX1 149 are normally-open switches positioned at junctions between the resistors of the ILadder1 146 in a similar manner as described above for the switches of the Main MUX 141 relative to the Main Ladder 139. The configuration and operation of the MUX1 149 is somewhat different, however, as further described below.

FIG. 7A is a simplified schematic diagram of selected portions of the Preamps1 143, the ILadder1 147 and corresponding switches of the MUX1 149. Only one polarity of the differential configuration is illustrated for purposes of clarity. The MUX1 149 connects selected voltage junctions of the ILadder 147 associated with a sequential pair of the Preamps1 143 to inputs of preamplifiers PA0–PA17 of the next stage Preamps2 151 upon a particular decision by the F2 flash converter 145. Configuration and operation of the Preamps2 151 is substantially identical as the Preamps1 143. The illustrated example shows the case in which the sampled AIN signal causes a zero crossing between preamplifiers PA9 and PA10 of the Preamps1 143. Thus, one of the preamplifiers PA9 and PA10 asserts a positive value whereas the other asserts a negative value indicating the zero crossing between the pair of preamplifiers.

Given normal or otherwise ideal operation, the F2 flash converter 145 detects the zero transition and asserts a DV2 value of 1000b and also asserts the M2 signal indicative thereof. In the embodiment shown, the individual signal M2(8) is asserted, which activates corresponding switches of the MUX1 149 to assert a selected subrange of the ILadder 147 associated with the preamplifiers PA9 and PA10 to the inputs of the Preamps2 151 as shown. Further, the MUX1 149 is configured to select 16 interpolated signals, including the 2 outputs of the preamplifiers PA9 and PA10, the 7 signals between the selected preamplifiers, 4 interpolated signals immediately above the preamplifier PA9 and 3 interpolated signals immediately below the preamplifier PA10. The 4 signals above and 3 signals below represent approximately half range overlap on either side of the selected preamplifiers to ensure that the input signal being resolved is within the selected range and to provide 1-bit digital redundancy that facilitates digital error correction by the error correction circuit 123. The 16 subrange signals of the Preamps1 143 and the ILadder1 147 are then provided to the inputs of the Preamps2 151 upon closure of the switches. The Preamps2 151 is a calibrated preamplifier stage configured substantially similar as the Preamps1 143, and thus includes two extra preamplifiers PA0 and PA17 on either side of the preamplifier array.

Continuing the ideal example, suppose the zero crossing occurs somewhere in the range of a resistor 701 of the ILadder 147 that is coupled between the inputs of the preamplifiers PA9 and PA10 of the Preamps2 151. Assuming that the F3 flash converter 153 is operating with ideal conditions, it too selects a correct DV3 value of 1000b in a similar manner as the F2 flash converter 145. Given the alignment and summation of consecutive DV1 values as previously described, the correct sum value of 1001000 is achieved.

FIG. 7B is a schematic diagram similar to FIG. 7A except illustrating error correction in the event voltage offsets within any of the flash converters causes an erroneous digital value to be generated. For example, assume that the zero crossing within the Preamps1 147 is identical as that of FIG. 7A. In FIG. 7B, however, a voltage offset within the F2 flash converter causes the F2 flash converter to assert the M2(9) signal and a DV2 value of 1001b. Given the selected overlap, the resistor 701 is still selected so that the zero crossing is still within the selected subrange so that the signal is not lost. The digital value representing the original analog signal is incorrect, however, since DV2 is 1001b rather than the correct value of 1000b, which would appear to cause an erroneous output result at DOUT. Nonetheless, the MUX1 149 selects the interpolated subrange of signals associated with the preamplifiers PA10 and PA11 of the Preamps1 147 including 4 resistors above and 3 resistors below according to the included overlap. In this manner, the zero crossing about the resistor 701 is applied between the preamplifiers PA1 and PA2 of the Preamps2 151. The next F3 flash converter 153, which operates in a substantially identical manner as the F2 flash converter 145, outputs a DV digital value of 0000b rather than the correct value of 1000b. Although it appears that the error has been propagated to make matters worse, in actuality the error is corrected during the alignment and summation operation. In particular, the digital values DV2 and DV3 from the F2 and F3 flash converters 145 and 153 are aligned and added together as shown, resulting in the correct sum value 1001000b. In this manner, as long as the flash converters 137, 145, 153, 161 and 169 accurately resolve 4 bits (and as long as the Main Ladder 139, the Preamps1 143 and the Preamps2 151 are properly calibrated), the error correction circuit 123 performs digital correction to resolve the correct digital value.

The F3, F4 and F5 flash converters 153, 161 and 169 are each configured in substantially the same manner as the F2 flash converter 145. The F5 flash converter 169, however, need not provide a corresponding M5 value since further subranging is not performed in the embodiment shown. The Preamps3 159 and Preamps4 167 are similar to the Preamps2 151 (which are similar to the Preamps1 143), except that the Preamps3 159 and Preamps4 167 are not calibrated. Thus, the additional outside preamplifiers of the preamplifier array are not necessary for the Preamps3 159 and Preamps4 167. The combination of multiplexors and resistor ladders MUX2 157 and ILadder2 155 and MUX3 and ILadder3 163 are similar in configuration and operation as the MUX1 149 and ILadder1 147. The ILadder4 171 is also similar to the ILadder1 147 except that intermediate switches and multiplex operation for subranging is not provided.

Many modifications and other embodiments of the invention will come to mind of one skilled in the art having the benefit of the teachings presented in the foregoing descriptions and the associated drawings. Although a system and method according to the present invention has been described in connection with one or more embodiments of the invention, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. An analog to digital converter (ADC), comprising:
a sampler that regularly samples an input analog signal and that provides a stream of sample signals;
a first stage, coupled to the sampler, that flash converts the stream of sample signals into corresponding primary multiple bit values and that subranges a reference ladder for each primary multiple bit value into corresponding sets of reference signals;
at least one secondary stage, each secondary stage coupled in sequential order after the first stage, that amplifies each set of residual signals from a prior stage, that interpolates each set of amplified residual signals using a resistive ladder, that flash converts each set of amplified residual signals into corresponding secondary multiple bit values, and that subranges the resistive ladder into corresponding sets of residual signals for each corresponding secondary multiple bit value; and
a final stage that amplifies each set of residual signals from a prior stage and that flash converts each set of amplified residual signals of the final stage into corresponding final multiple bit values; and
an error corrector, coupled to the first and final stages and each secondary stage, that combines each primary multiple bit value with one or more corresponding secondary multiple bit values and a corresponding final multiple bit value to provide a corresponding stream of digital values representative of the input analog signal.

2. The ADC of claim 1, wherein the error corrector comprises:
an adder that adds each set of corresponding multiple bit values from most significant to least significant to determine a corresponding sum value, and that determines a corresponding digital value based on each sum value.

3. The ADC of claim 2, wherein the adder aligns the most significant bit of each secondary and final multiple bit value with the least significant bit of a corresponding multiple bit value determined by an adjacent previous stage.

4. The ADC of claim 3, wherein the adder discards at least one least significant bit of each sum value to determine a corresponding digital value.

5. The ADC of claim 1, wherein the first stage comprises:

a flash ladder, receiving a reference voltage, that provides a series of intermediate voltages;

a first flash converter, coupled to the flash ladder, that compares each sample signal with the series of intermediate voltages and that decodes a resulting comparison into corresponding primary multiple bit values;

a reference resistive ladder, receiving the reference voltage, that provides an interpolated series of reference voltages; and first select logic, coupled to the first flash converter and the reference resistive ladder, that outputs a plurality of tap voltages within a selected subrange of the reference resistive ladder corresponding to each primary multiple bit value.

6. The ADC of claim 5, wherein the first flash converter comprises:

a plurality of amplifiers, each having a first input coupled to at least one coresponding junction of the flash ladder and a second input receiving the stream of sample signals;

a plurality of latches, each coupled to a corresponding one of the plurality of amplifiers, for latching an output of the corresponding amplifier to a binary value; and a decoder, coupled to the plurality of latches, that determines a binary transition for each sample signal and that generates a corresponding primary multiple bit value indicative thereof.

7. The ADC of claim 6, wherein the first select logic and first flash converter are collectively configured to select an overlap of tap voltages of the reference resistive ladder relative to the binary transition.

8. The ADC of claim 5, wherein the sampler comprises:

a first track and hold circuit receiving a clock signal that tracks the analog signal for a first portion of the clock cycle and that holds a first sample signal for the remaining portion of the clock cycle; and a second track and hold circuit receiving the clock signal that tracks the first sample signal from the first track and hold circuit for the remaining portion of the clock cycle and that holds a second sample signal during the following portion of the clock cycle;

wherein the first sample signal is provided to the first flash converter.

9. The ADC of claim 8, wherein a first secondary stage comprises:

a plurality of first preamplifiers, each amplifying a difference between each second sample signal and each tap voltage of a corresponding selected subrange of the reference resistive ladder.

10. The ADC of claim 1, wherein each secondary stage comprises:

a plurality of preamplifiers, coupled to select logic of a prior stage, for collectively amplifying a residual signal defined within a selected portion of a resistive ladder of the prior stage;

a resistive interpolation ladder, coupled to outputs of the set of preamplifiers, that interpolates amplified residual signals;

a flash converter, coupled to the plurality of preamplifiers, that converts each set of amplified residual signals into a corresponding second multiple bit value; and select logic, coupled to the flash converter and the resistive interpolation ladder, that outputs a set of selected interpolated signals within a corresponding selected subrange of the resistive interpolation ladder for each corresponding second multiple bit value.

11. The ADC of claim 10, wherein the select logic is configured to include an overlap for each selected portion of the resistive interpolation ladder.

12. The ADC of claim 11, wherein the select logic includes a plurality of switches that select interpolative junctions between a selected sequential pair of the plurality of preamplifiers and that select an overlap including interpolative junctions on either side of the selected sequential pair.

13. The ADC of claim 10, wherein the flash converter comprises:

a plurality of amplifiers, each having an input coupled to an output of a corresponding one of the plurality of preamplifiers;

a plurality of latches, each having an input coupled to an output of a corresponding one of the plurality of amplifiers; and a decoder, coupled to the plurality of latches, that determines a binary transition for each set of amplified residual signals and that generates a corresponding multiple bit value indicative thereof.

14. The ADC of claim 1, further comprising calibration circuitry that calibrates the reference ladder, a first set of preamplifiers within a first secondary stage and a second set of preamplifiers within a second secondary stage.

15. The ADC of claim 14, wherein the calibration circuitry is configured to operate in the background without effecting normal operation of the ADC.

16. An analog to digital converter, comprising:

a track and hold circuit that samples an analog signal;

a flash ladder;

a first flash converter, coupled to the flash ladder and receiving a sample of the analog signal, that generates a first set of bits;

a reference resistive ladder having a plurality of tapped reference voltages;

first select logic, coupled to the first flash converter and the reference resistive ladder, that selects a portion of the reference resistive ladder corresponding to the first set of bits;

a first set of preamplifiers, coupled to the first select logic and the reference resistive ladder, that amplifies a difference between the analog sample and each of the plurality of tapped voltages of the selected portion of the resistive reference ladder;

a first interpolator resistive ladder that interpolates the outputs of the first set of amplifiers;

a second flash converter, coupled to the first set of amplifiers, that determines a second set of bits indicative of a zero-crossing of outputs of the first set of preamplifiers;

second select logic, coupled to the second flash converter, the first set of preamplifiers and the first interpolator resistive ladder, that selects a plurality of tapped voltages within a portion of the first interpolator resistive ladder corresponding to the second set of bits;

a second set of preamplifiers, coupled to the second select logic and the first interpolator resistive ladder, that amplifies a difference of each of the selected plurality of tapped voltages of the first interpolator resistive ladder;

a third flash converter, coupled to the second set of amplifiers, that determines a third set of bits indicative of a zero-crossing of outputs of the second set of preamplifiers; and a combiner that combines the first, second and third sets of bits to provide a digital value representative of the sample.

17. The analog to digital converter of claim 16, further comprising:

a second interpolator resistive ladder that interpolates the outputs of the second set of amplifiers;

third select logic, coupled to the third flash converter and the second interpolator resistive ladder, that selects a plurality of tapped voltages within a portion of the second interpolator resistive ladder corresponding to the third set of bits;

a third set of preamplifiers, coupled to the third select logic and the second interpolator resistive ladder, that amplifies a difference of each of the selected plurality of tapped voltages of the second interpolator resistive ladder; and a fourth flash converter, coupled to the third set of amplifiers, that determines a fourth set of bits indicative of a zero-crossing of outputs of the third set of preamplifiers; and wherein the combiner combines the first, second, third and fourth sets of bits to provide the digital output value representative of the sample.

18. The analog to digital converter of claim 17, further comprising:

a third interpolator resistive ladder that interpolates the outputs of the third set of amplifiers;

fourth select logic, coupled to the fourth flash converter and the third interpolator resistive ladder, that selects a plurality of tapped voltages within a portion of the third interpolator resistive ladder corresponding to the fourth set of bits;

a fourth set of preamplifiers, coupled to the fourth select logic and the third interpolator resistive ladder, that amplifies a difference of each of the selected plurality of tapped voltages of the third interpolator resistive ladder;

a fifth flash converter, coupled to the fourth set of amplifiers, that determines a fifth set of bits indicative of a zero-crossing of outputs of the fourth set of preamplifiers; and wherein the combiner combines the first, second, third, fourth and fifth sets of bits to provide the digital output value representative of the sample.

19. The analog to digital converter of claim 18, wherein the combiner comprises an adder that aligns the first, second, third, fourth and fifth sets of bits based on most significant to least significant and that adds the aligned bits.

20. The analog to digital converter of claim 18, wherein the first, second, third and fourth select logic are each configured to select overlapping portions of the reference resistive ladder, the first interpolator resistive ladder, the second interpolator resistive ladder and the third interpolator resistive ladder, respectively.

21. The analog to digital converter of claim 16, wherein the first flash converter and first select logic are configured to select an overlapping portion of the reference resistive ladder relative to the first set of bits.

22. The analog to digital converter of claim 21, wherein the reference resistive ladder includes a primary resistor ladder with primary resistors coupled in series forming intermediate junctions and a secondary resistive array including groups of series-coupled resistors each coupled in parallel with a corresponding one of the primary resistors, wherein each group of series-coupled resistors of the secondary resistive array includes corresponding intermediate junctions, wherein the first select logic includes switches at each junction of the primary resistor ladder and the secondary resistive array, and wherein the first flash converter activates switches of the first select logic associated with a sequential pair of primary resistors.

23. The analog to digital converter of claim 16, wherein the second flash converter and second select logic are configured to select an overlapping portion of the first interpolator resistive ladder relative to the second set of bits.

24. The analog to digital converter of claim 23, wherein the first interpolator resistive ladder includes a plurality of resistors coupled in series forming a plurality of intermediate junctions, wherein the second select logic comprises a plurality of switches each coupled to a corresponding one of the plurality of intermediate junctions, wherein the first set of amplifiers has a plurality of outputs coupled to respective intermediate junctions of the plurality of resistors leaving a number of intermediate junctions located between each amplifier output, and wherein the second flash converter activates switches to select intermediate junctions between a selected pair of amplifiers of the first set of preamplifiers and an overlapping number of intermediate junctions on either side of the selected pair of amplifiers.

25. The analog to digital converter of claim 16, wherein the combiner comprises:

an adder that aligns the sets of bits from most significant to least significant and that adds the aligned bits to generate a sum value.

26. The analog to digital converter of claim 16, wherein the first flash converter comprises:

a plurality of amplifiers, each having a first input coupled to at least one corresponding junction of the flash ladder and a second input receiving the analog sample;

a plurality of latches, each coupled to an output of a corresponding one of the plurality of amplifiers; and a decoder, coupled to outputs of the plurality of latches, that determines a binary transition and that generates the first set of bits indicative thereof.

27. The analog to digital converter of claim 16, wherein the second and third flash converters each comprise:

a plurality of amplifiers, each having an input coupled to an output of a corresponding one of the first and second sets of preamplifiers;

a plurality of latches, each having an input coupled to an output of a corresponding one of the plurality of amplifiers; and a decoder, coupled to the plurality of latches, that determines a binary transition of the plurality of latches and that generates a corresponding set of bits indicative thereof.

28. The analog to digital converter of claim 16, further comprising calibration logic that operates to adjust the plurality of tapped reference voltages of the reference resistive ladder and that adjusts offset voltages of each preamplifier of at least one set of preamplifiers.

29. A method of converting an analog signal to digital values, comprising:

regularly sampling the analog signal to provide a stream of sample signals;

dividing a reference signal into a plurality of intermediate signals and separately into a plurality of reference signals;

flash converting each sample signal with the plurality of intermediate reference signals to determine corresponding first binary values;

selecting a subrange of the plurality of reference signals based on each first binary value;

amplifying a difference between each sample signal and each reference signal of a corresponding selected subrange of reference signals to provide corresponding sets of first amplified residual signals;

flash converting each set of first amplified residual signals to determine corresponding second binary values;

interpolating each set of first amplified residual signals to provide corresponding sets of first interpolated signals;

selecting a subrange of signals of each set of first interpolated signals based on each second binary value;

amplifying the subrange of signals of each set of first interpolated signals to provide corresponding sets of second amplified residual signals;

flash converting each set of second amplified residual signals to determine corresponding third binary values; and combining corresponding sets of first, second and third binary values to generate a digital output value.

30. The method of claim 29, further comprising:

interpolating each set of second amplified residual signals to provide corresponding sets of second interpolated signals;

selecting a subrange of signals of each set of second interpolated signals based on each third binary value;

amplifying the subrange of signals of each set of second interpolated signals to provide corresponding sets of third amplified residual signals;

flash converting each set of third amplified residual signals to determine corresponding fourth binary values; and said combining comprising combining corresponding sets of first, second, third and fourth binary values to generate the digital output value.

31. The method of claim 30, further comprising:

interpolating each set of third amplified residual signals to provide corresponding sets of third interpolated signals;

selecting a subrange of signals of each set of third interpolated signals based on each fourth binary value;

amplifying the subrange of signals of each set of third interpolated signals to provide corresponding sets of fourth amplified residual signals;

flash converting each set of fourth amplified residual signals to determine corresponding fifth binary values; and said combining comprising combining corresponding sets of first, second, third, fourth and fifth binary values to generate the digital output value.

32. The method of claim 31, wherein said combining comprises:

aligning the first, second, third, fourth and fifth binary values from most significant to least significant, respectively; and adding the aligned binary values to achieve a sum value.

33. The method of claim 32, wherein said aligning comprises:

aligning the least significant bit of corresponding first, second, third and fourth binary values with the most significant bit of corresponding second, third, fourth and fifth binary values, respectively.

34. The method of claim 32, further comprising:

discarding at least one least significant bit of the sum value.

35. The method of claim 29, wherein each said flash converting comprises:

comparing a plurality of differential signals;

latching comparator results into a plurality of comparator values;

decoding the plurality of comparator values to determine a binary transition point; and providing a binary value indicative of the transition point.

36. The method of claim 29, further comprising periodically calibrating selected functions to maintain a predetermined linearity specification.

37. A method of converting an analog signal to a digital value, comprising:

sampling the analog signal;

flash converting the analog sample with a plurality of intermediate signals of a reference signal to determine a first binary value;

dividing the reference signal to provide a plurality of accurate reference signals;

subranging the plurality of accurate reference signals based on the first binary value;

amplifying a difference between the analog sample and subranged reference signals to provide amplified residual signals;

repeating each of the following flash converting, interpolating, subranging and amplifying for the analog sample to determine a sufficient number of binary values to achieve a desired resolution, including:

flash converting amplified residual signals to determine a subsequent binary value;

interpolating the amplified residual signals;

subranging the amplified residual signals based on the subsequent binary value; and amplifying the subranged amplified residual signals; and combining the determined binary values to determine the digital value.

38. The method of claim 37, wherein said combining comprises:

aligning the determined binary values from most significant to least significant, respectively; and adding the aligned binary values to achieve a sum value.

39. The method of claim 38, wherein said aligning comprises:

aligning the most significant bit of each subsequent binary value with the least significant bit of a prior binary value.

40. The method of claim 37, prior to said combining, further comprising performing a final flash converting to determine a final subsequent binary value.

* * * * *